US012677657B2

(12) United States Patent
Song

(10) Patent No.: US 12,677,657 B2
(45) Date of Patent: Jul. 7, 2026

(54) SEMICONDUCTOR PACKAGES HAVING CAPACITORS

(71) Applicant: SAMSUNG ELECTRONICS CO., LTD., Suwon-si (KR)

(72) Inventor: Eunseok Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 389 days.

(21) Appl. No.: 18/541,147

(22) Filed: Dec. 15, 2023

(65) Prior Publication Data

US 2024/0213143 A1 Jun. 27, 2024

(30) Foreign Application Priority Data

Dec. 27, 2022 (KR) ......................... 10-2022-0185863

(51) Int. Cl.
*H10W 20/40* (2026.01)
*H10W 90/00* (2026.01)

(52) U.S. Cl.
CPC ......... *H10W 20/496* (2026.01); *H10W 90/00* (2026.01); *H10W 90/701* (2026.01); *H10W 90/722* (2026.01); *H10W 90/724* (2026.01); *H10W 90/792* (2026.01); *H10W 90/794* (2026.01)

(58) Field of Classification Search
CPC ............. H10W 20/496; H10W 90/401; H10W 44/601; H10W 90/00; H10W 90/701; H10W 90/792; H10W 90/794; H10W 70/60; H10W 70/652; H10W 70/611; H10W 70/05; H10W 90/722; H10W 90/724

See application file for complete search history.

(56) References Cited

U.S. PATENT DOCUMENTS

| | | | | |
|---|---|---|---|---|
| 8,618,651 B1 * | 12/2013 | Yee | ..................... | H10W 20/023 |
| | | | | 257/E21.597 |
| 9,247,646 B2 | 1/2016 | Sato et al. | | |
| 9,368,566 B2 | 6/2016 | Lee et al. | | |
| 2018/0358298 A1 | 12/2018 | Zhai et al. | | |
| 2020/0176417 A1 | 6/2020 | Navaja et al. | | |
| 2020/0253040 A1 | 8/2020 | Dalmia et al. | | |
| 2021/0082842 A1 | 3/2021 | He et al. | | |
| 2022/0068904 A1 | 3/2022 | Park et al. | | |
| 2022/0216154 A1 | 7/2022 | Liang et al. | | |
| 2023/0062775 A1 * | 3/2023 | Hsu | ........................ | H10W 70/05 |

* cited by examiner

*Primary Examiner* — Wasiul Haider
(74) *Attorney, Agent, or Firm* — Sughrue Mion, PLLC

(57) ABSTRACT

A semiconductor package includes a package substrate, an interposer above the package substrate, a connection terminal between the package substrate and the interposer, a first semiconductor chip and a second semiconductor chip above the interposer, a bridge in the interposer, the bridge connected to the first semiconductor chip and the second semiconductor chip, a capacitor structure in the interposer, the capacitor structure including an upper structure including an upper capacitor and a lower structure including a lower capacitor, and a chip connection terminal including at least one first chip connection terminal between the interposer and the first semiconductor chip and at least one second chip connection terminal between the interposer and the second semiconductor chip.

20 Claims, 10 Drawing Sheets

A

B

SEMICONDUCTOR PACKAGES HAVING CAPACITORS

CROSS-REFERENCE TO RELATED APPLICATION(S)

This application is based on and claims priority to Korean Patent Application No. 10-2022-0185863, filed on Dec. 27, 2022, in the Korean Intellectual Property Office, the disclosure of which is incorporated herein by reference in its entirety.

BACKGROUND

1. Field

Example embodiments of the disclosure relate to semiconductor packages having capacitors.

2. Description of Related Art

With an increase in the demand for high performance, high speed, and/or multifunctionality of semiconductor devices, the degree of integration of semiconductor devices has been increasing. In manufacturing semiconductor devices with fine patterns in response to the tendency for high integration of semiconductor devices, it may be necessary to implement patterns with fine widths or fine separation distances. Furthermore, high integration of passive devices mounted on semiconductor packages may be required.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

One or more example embodiments provide semiconductor packages having a capacitor structure in which an upper structure and a lower structure are bonded.

Additional aspects will be set forth in part in the description which follows and, in part, will be apparent from the description, or may be learned by practice of the presented embodiments.

According to an aspect of an example embodiment, a semiconductor package may include a package substrate, an interposer above the package substrate, a connection terminal between the package substrate and the interposer, a first semiconductor chip and a second semiconductor chip above the interposer, a bridge in the interposer, the bridge connected to the first semiconductor chip and the second semiconductor chip, a capacitor structure in the interposer, the capacitor structure including an upper structure including an upper capacitor and a lower structure including a lower capacitor, and a chip connection terminal including at least one first chip connection terminal between the interposer and the first semiconductor chip and at least one second chip connection terminal between the interposer and the second semiconductor chip, where the upper structure may include a first front surface and a first rear surface that is opposite to the first front surface, the lower structure may include a second front surface and a second rear surface that is opposite to the second front surface and the first rear surface may directly contact the second rear surface.

According to an aspect of an example embodiment, a semiconductor package may include a package substrate, an interposer above the package substrate, a connection terminal between the package substrate and the interposer, a first semiconductor chip and a second semiconductor chip above the interposer, capacitor structures in at least one of the package substrate and the interposer, where each of the capacitor structures may include an upper structure including an upper capacitor, and a lower structure including a lower capacitor, and a chip connection terminal including at least one first chip connection terminal between the interposer and the first semiconductor chip and at least one second chip connection terminal between the interposer and the second semiconductor chip, where the upper structure may include a first front surface and a first rear surface that is opposite to the first front surface, the lower structure may include a second front surface and a second rear surface that is opposite to the second front surface and the first rear surface may directly contact the second rear surface.

According to an aspect of an example embodiment, a semiconductor package may include a package substrate, an interposer above the package substrate, a first semiconductor chip and a second semiconductor chip above the interposer, a capacitor structure in the interposer and including a semiconductor layer, and a chip connection terminal including at least one first chip connection terminal between the interposer and the first semiconductor chip and at least one second chip connection terminal between the interposer and the second semiconductor chip, where the capacitor structure may include an upper capacitor in the semiconductor layer or on the semiconductor layer and a lower capacitor in the semiconductor layer or below the semiconductor layer, the semiconductor layer may include a lower substrate and an upper substrate on the lower substrate and the lower substrate may be materially continuous with the upper substrate.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
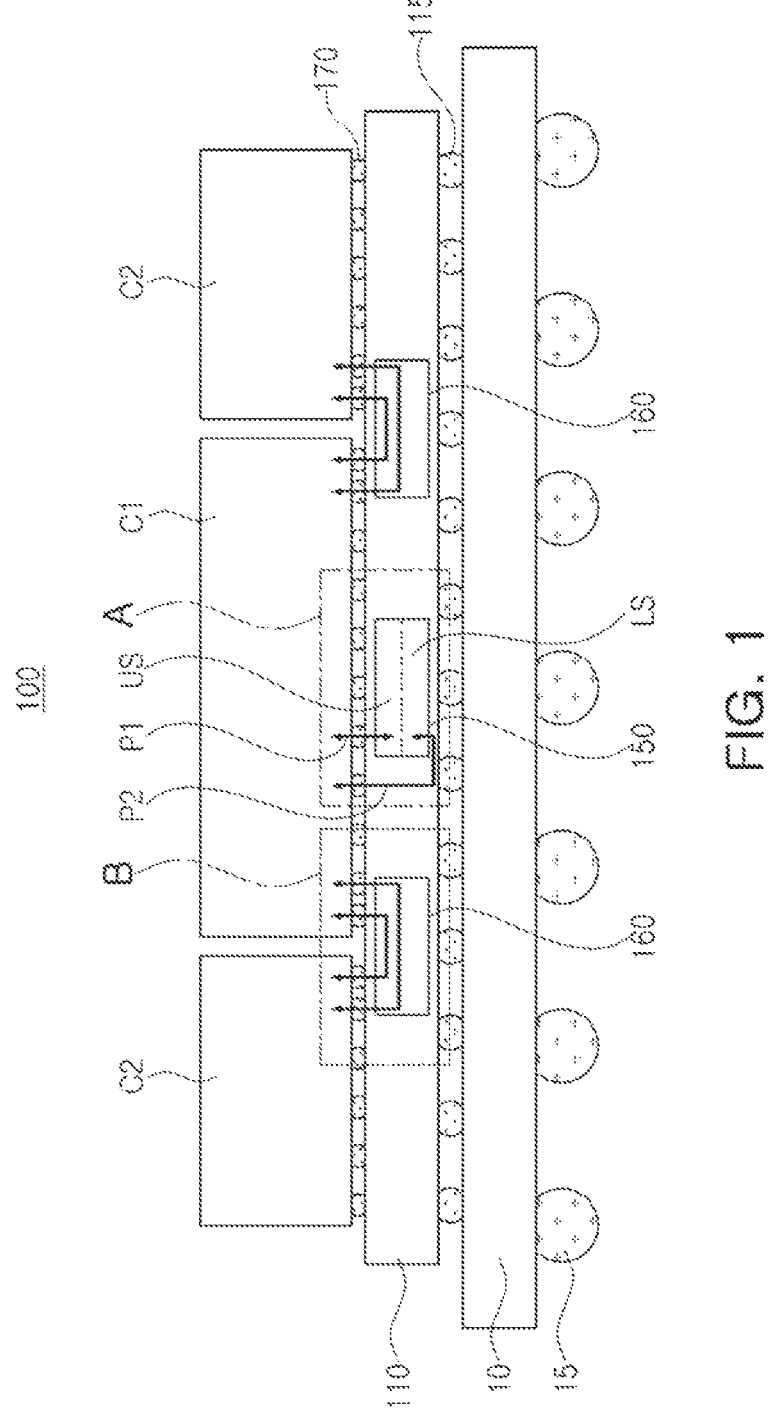
FIG. 1 is a cross-sectional view of a semiconductor package according to example embodiments.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

Figure 2:
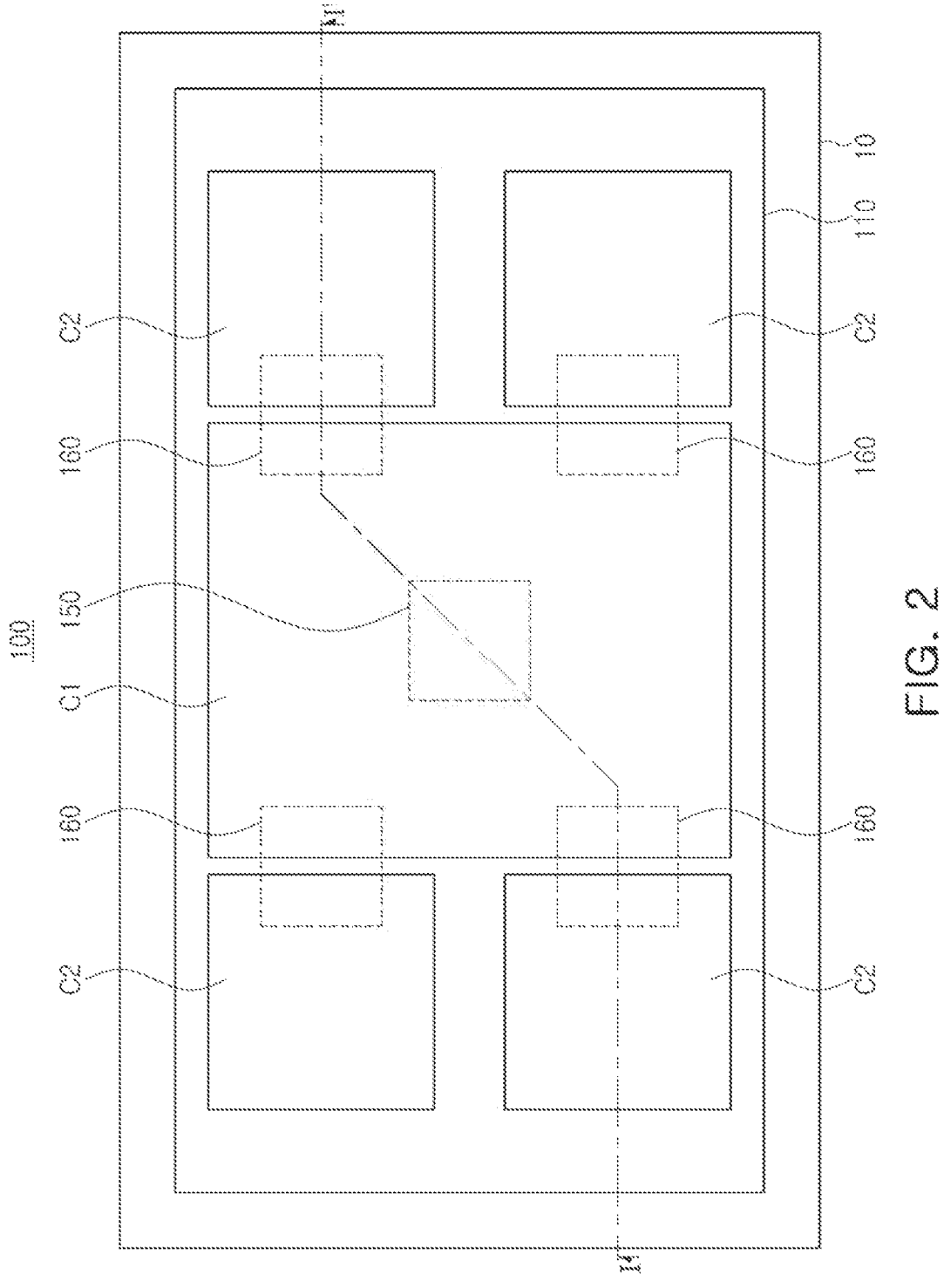
FIG. 2 is a top view of the semiconductor package illustrated in FIG. 1 according to example embodiments.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c FIG. 1 is a cross-sectional view of a semiconductor package according to example embodiments. FIG. 2 is a top view of the semiconductor package illustrated in FIG. 1 according to example embodiments. That is, FIG. 1 is a vertical cross-sectional view of the semiconductor package along line I-I' illustrated in FIG. 2.

Referring to FIGS. 1 and 2, a semiconductor package 100 according to an example embodiment of the present disclosure may include a package substrate 10, an external connection terminal 15, an interposer 110, a connection terminal 115, a capacitor structure 150, a bridge 160, a first semiconductor chip C1, a second semiconductor chip C2, and a chip connection terminal 170.

The package substrate 10 may be a substrate for a semiconductor package such as a printed circuit board (PCB), a ceramic substrate, and a tape wiring board. For example, the package substrate 10 may include a thermosetting resin such as an epoxy resin or a thermoplastic resin such as polyimide, or a photosensitive insulating layer. The package substrate 10 may include materials such as a prepreg, an Ajinomoto build-up film (ABF), FR-4, Bismaleimide Triazine (BT), and Photoimageable Dielectric Resin (PID).

The external connection terminal 15 may be disposed below the package substrate 10. The external connection terminal 15 may be electrically connected to an external device such as a main board. For example, the external connection terminal 15 may have a grid array such as a solder ball, a conductive bump, or a pin grid array, a ball grid array, or a land grid array.

The interposer 110 may be mounted on the package substrate 10. The connection terminal 115 may be disposed below the interposer 110 and connect the interposer 110 to the package substrate 10. The interposer 110 may be electrically connected to the first semiconductor chip C1 and the second semiconductor chip C2 disposed above the interposer 110. For example, the interposer 110 may electrically connect the first semiconductor chip C1 and the second semiconductor chip C2 to the package substrate 10. The interposer 110 may also electrically connect the first semiconductor chip C1 to the second semiconductor chip C2.

The first semiconductor chip C1 and the second semiconductor chip C2 may be mounted over the interposer 110. The chip connection terminal 170 may be disposed below the first semiconductor chip C1 and the second semiconductor chip C2 to connect the first semiconductor chip C1 and the second semiconductor chip C2 to the interposer 110. An underfill for covering or at least partially covering the chip connection terminal 170 may be disposed below the first semiconductor chip C1 and the second semiconductor chip C2. The first semiconductor chip C1 may be disposed at a center of the interposer 110, and the second semiconductor chip C2 may be disposed at an edge of the interposer 110. However, the number and arrangement of the first semiconductor chip C1 and the second semiconductor chip C2 are exemplary, and in example embodiments, the first semiconductor chip C1 and the second semiconductor chip C2 may have various arrangement structures.

The first semiconductor chip C1 and the second semiconductor chip C2 may be logic chips or memory chips. The logic chip may include a processor such as micro electro mechanical systems (MEMS) device, an optoelectronic device, a central processing unit (CPU), a graphic processing unit (GPU), a mobile application, or a digital signal processor (DSP). The memory device may include a NAND flash memory, a magneto-resistive random access memory (RAM) (MRAM), a phase-change RAM (PRAM), a ferroelectric RAM (FeRAM), a resistive RAM (RRAM), an X-point RAM (X-point RAM), a dynamic RAM (DRAM), a static RAM (SRAM), a high bandwidth memory (HBM), a hybrid memory cubic (HMC) or combinations thereof. In an example embodiment, the first semiconductor chip C1 may be the logic chip, and the second semiconductor chip C2 may be the memory chip. For example, the second semiconductor chip C2 may include the HBM.

The chip connection terminal 170 may include at least one of copper (Cu), nickel (Ni), tin (Sn), and an alloy (Sn—Ag) including tin (Sn). For example, the chip connection terminal 170 may include a pillar portion connected to a chip pad CP illustrated in FIG. 3 and a solder portion disposed below the pillar portion. The pillar portion may include at least one of copper (Cu) and nickel (Ni), and the solder portion may include the alloy (Sn—Ag) including tin (Sn).

The capacitor structure 150 may be disposed in the interposer 110. For example, the capacitor structure 150 may be embedded in the interposer 110. The capacitor structure 150 may reduce power noise when the semiconductor package 100 operates at a high frequency. For example, the capacitor structure 150 may be electrically connected to the second semiconductor chip C2 and may reduce power noise provided from the package substrate 10 to the second semiconductor chip C2. In a plan view, the capacitor structure 150 may be disposed at the center of the second semiconductor chip C2. However, the present disclosure is not limited thereto. Although one capacitor structure 150 is illustrated as being disposed, the present disclosure is not limited thereto. In example embodiments, the semiconductor package 100 may include a plurality of capacitor structures 150 in the interposer 110.

The bridge 160 may be disposed in the interposer 110. For example, the bridge 160 may be embedded in the interposer 110. The bridge 160 may electrically connect the first semiconductor chip C1 and the second semiconductor chip C2. The first semiconductor chip C1 and the second semiconductor chip C2 may at least partially overlap the bridge 160 in a vertical direction (e.g., the chips C1 and C2 may at least partially cover the bridge 160), and, in a plan view, the bridge 160 may be disposed between the first semiconductor chip C1 and the second semiconductor chip C2.

Figure 3:
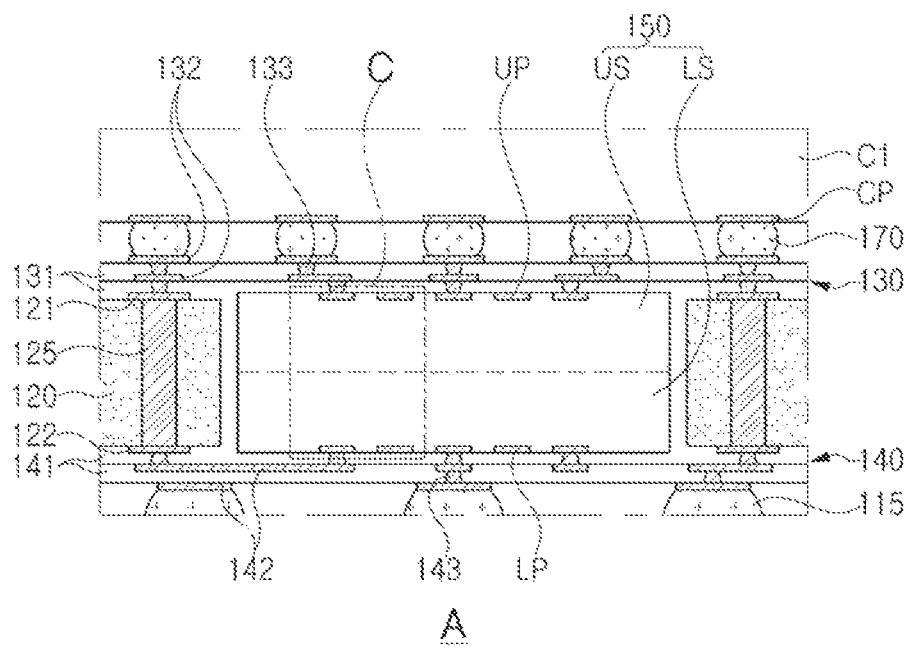
FIG. 3 is an enlarged view of the semiconductor package illustrated in FIG. 1 according to example embodiments.

FIG. 3 is an enlarged view of the semiconductor package illustrated in FIG. 1 according to example embodiments. FIG. 3 corresponds to region A illustrated in FIG. 1.

Referring to FIG. 3, the interposer 110 may include a core insulation layer 120, a core wiring 121, a core wiring 122, a through-via 125, an upper redistribution structure 130, and a lower redistribution structure 140.

The core insulating layer 120 may be disposed between the upper redistribution structure 130 and the lower redistribution structure 140. The core insulating layer 120 may suppress warpage of the interposer 110 by increasing rigidity of the interposer 110. The core insulating layer 120 may include an insulating material (e.g., a thermosetting resin such as an epoxy resin, a thermoplastic resin such as polyimide, or a prepreg including an inorganic filler or/and a glass fiber (e.g., a glass cloth or a glass fabric), an Ajinomoto build-up film (ABF), FR-4, etc.). The core insulation layer 120 may be formed using, for example, a copper clad laminate (CCL), an unclad copper laminate (unclad CCL), a glass substrate or a ceramic substrate.

The core wiring 121 and the core wiring 122 may be disposed on upper and lower surfaces of the core insulating layer 120 and may extend in a horizontal direction. The core wirings 121 and 122 may include a conductive material, such as at least one metal of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C).

The through-via 125 may penetrate the core insulating layer 120 to connect the core wiring 121 and the core wiring 122. The through-via 125 may be formed by filling a via hole vertically penetrating the core insulating layer 120 with a conductive material. Alternatively, when the through-via 125 is formed by forming the conductive material along the wall of the via hole, a space inside the via hole may be filled with an insulating material such as an epoxy resin. The through-via 125 may include the same material as the core wirings 121 and 122.

The upper redistribution structure 130 may be disposed above the core insulation layer 120 and the capacitor structure 150, and may be electrically connected to the through-via 125 and the capacitor structure 150. The upper redistribution structure 130 may also be electrically connected to the first semiconductor chip C1 and the second semiconductor chip C2 through the chip connection terminal 170 and the chip pad CP. The upper redistribution structure 130 may include an insulating layer 131, a wiring layer 132, and a via 133.

The insulating layer 131 may have a structure in which a plurality of layers formed of an insulating material are stacked in a vertical direction. A plurality of insulating layers 131 may be integrated such that a boundary between the plurality of insulating layers 131 may not be clear. The insulating material may include, for example, a thermosetting resin such as an epoxy resin, a thermoplastic resin such as polyimide, a prepreg including an inorganic filler or/and a glass fiber, ABF, and FR-4.

The wiring layer 132 may include a plurality of wiring layers 132 disposed on different levels. The wiring layer 132 may be electrically connected to at least one of the through-via 125 and the capacitor structure 150. The wiring layer 132 may include a ground pattern, a power pattern, and a signal pattern. The via 133 may penetrate at least a portion of the insulating layer and may be connected to the wiring layer 132, the core wiring 121, or the capacitor structure 150. The wiring layer 132 and the via 133 may include a conductive material, for example, at least one metal of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C).

The lower redistribution structure 140 may be disposed below the core insulation layer 120 and the capacitor structure 150 and may be electrically connected to the through-via 125 and the capacitor structure 150. The lower redistribution structure 140 may also be electrically connected to the package substrate 10 through the connection terminal 115. The lower redistribution structure 140 may include an insulating layer 141, a wiring layer 142, and a via 143.

The insulating layer 141, the wiring layer 142, and the via 143 of the lower redistribution structure 140 may have the same structure as the insulating layer 131, the wiring layer 132, and the via 133 of the upper redistribution structure 130, respectively, and may include the same material. A portion of the insulating layer 131 of the upper redistribution structure 130 and a portion of the insulating layer 141 of the lower redistribution structure 140 may extend vertically between the core insulating layer 120 and the capacitor structure 150. A portion of the insulating layer 131 of the upper redistribution structure 130 and a portion of the insulating layer 141 of the lower redistribution structure 140 may be formed integrally and may be materially continuous with each other. However, the structure of the interposer 110 illustrated in FIG. 3 is exemplary, and various structures including the capacitor structure 150 and the bridge 160 may be applied in example embodiments.

The capacitor structure 150 may be disposed between the upper redistribution structure 130 and the lower redistribution structure 140, and may be disposed between the core insulating layers 120. The capacitor structure 150 may be formed by bonding an upper structure US and a lower structure LS. Each of the upper structure US and the lower structure LS may include a capacitor therein. The upper structure US may include an upper pad UP connected to the upper redistribution structure 130 on an upper surface thereof, and the lower structure LS may include a lower pad LP connected to the lower redistribution structure 140 on a lower surface thereof. The upper pad UP may be electrically connected to the upper redistribution structure 130 through the via, and the lower pad LP may be electrically connected to the lower redistribution structure 140 through the via. The upper structure US and the lower structure LS may have substantially the same horizontal width, and a side surface of the upper structure US may be coplanar with a side surface of the lower structure LS.

As illustrated in FIG. 1, the capacitor structure 150 may provide a first power path P1 and a second power path P2. For example, the upper structure US of the capacitor structure 150 may provide the first power path P1 electrically connected to the first semiconductor chip C1 through the upper redistribution structure 130 and the chip connection terminal 170. Furthermore, the lower structure LS of the capacitor structure 150 may provide a second power path P2 electrically connected to the first semiconductor chip C1 through the lower redistribution structure 140, the through-via 125, the upper redistribution structure 130, and the chip connection terminal 170. The capacitor structure 150 may also be electrically connected to the package substrate 10 through the lower redistribution structure 140 and the connection terminal 115.

Figure 4:
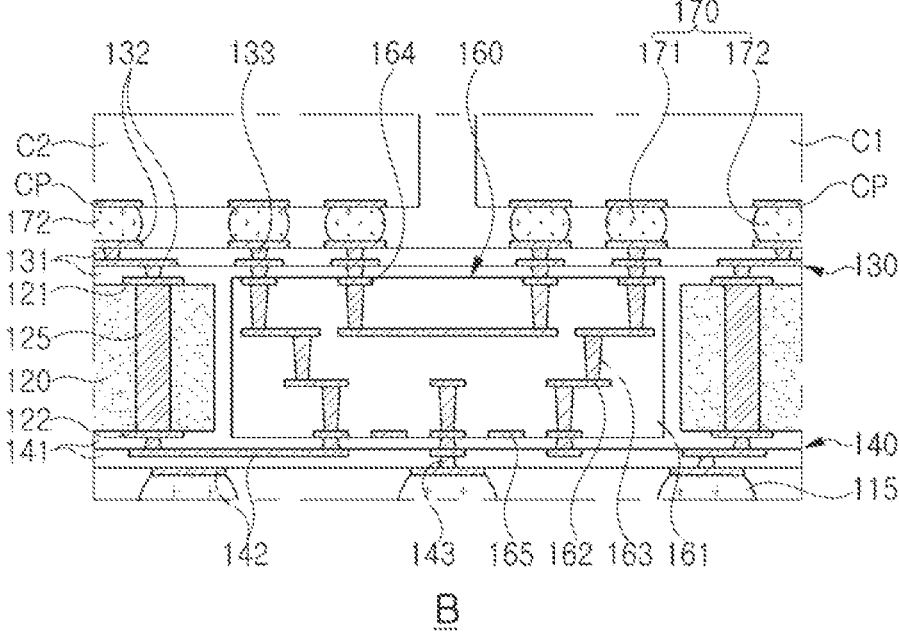
FIG. 4 is an enlarged view of the semiconductor package illustrated in FIG. 1 according to example embodiments.

FIG. 4 is an enlarged view of the semiconductor package illustrated in FIG. 1 according to example embodiments. FIG. 4 corresponds to region B illustrated in FIG. 1.

Referring to FIG. 4, the bridge 160 may be disposed between the core insulating layers 120 and may be disposed between the upper redistribution structure 130 and the lower redistribution structure 140. The bridge 160 may include an insulating layer 161, a wiring layer 162, a via 163, an upper pad 164, and a lower pad 165. The insulating layer 161 may cover or at least partially cover the wiring layer 162 and the via 163, and may include an insulating material made up of a plurality of layers. The wiring layer 162 may include a plurality of wiring layers 162 disposed on different levels, and the via 163 may connect the wiring layer 162 located on the different levels. The upper pad 164 and the lower pad 165 may be connected to the wiring layer 162 through the via 163.

The bridge 160 may electrically connect the first semiconductor chip C1 to the second semiconductor chip C2. For example, the first semiconductor chip C1 and the second semiconductor chip C2 may be electrically connected through the chip connection terminal 170, the upper redistribution structure 130, and the bridge 160. The first semiconductor chip C1 may be electrically connected to the wiring layer 162 of the bridge 160 through at least one of the upper pads 164, and the wiring layer 162 may be electrically connected to the second semiconductor chip C2 through at least one of the upper pads 164. The bridge 160 may also be electrically connected to the lower redistribution structure 140 through the lower pad 165.

The structure of the bridge 160 illustrated in FIG. 4 is exemplary and is not limited thereto. In some example embodiments, the bridge 160 may not be embedded in the interposer 110. For example, the interposer 110 may include a recess on an upper surface thereof, and the bridge 160 may be disposed in the recess.

Referring to FIGS. 1 and 4, in an example embodiment, a pitch of the chip connection terminal 170 may not be constant. For example, the chip connection terminal 170 may include first chip connection terminals, such as terminal 171, and second chip connection terminals, such as terminal 172. The first chip connection terminal 171 may be disposed below the first semiconductor chip C1 or the second semiconductor chip C2, may be electrically connected to the bridge 160. In a vertical direction, the first chip connection terminal 171 may be positioned within a width of the bridge 160 (i.e., the first chip connection terminal 171 may be positioned above the bridge 160 and within the width of the bridge 160). The second chip connection terminal 172 may be disposed below the first semiconductor chip C1 or the second semiconductor chip C2, may not be electrically connected to the bridge 160, and may not be positioned within a width of the bridge 160 in the vertical direction (i.e., the second chip connection terminal 172 may be positioned above the bridge 160 but not within the width of the bridge 160). A pitch of the first chip connection terminals 171 may be less than a pitch of the second chip connection terminals 172. That is, a pitch of the chip connection terminals that are within the width of the bridge 160 may be less than a pitch of chip connection terminals that are outside of the width of the bridge 160.

Figure 5:
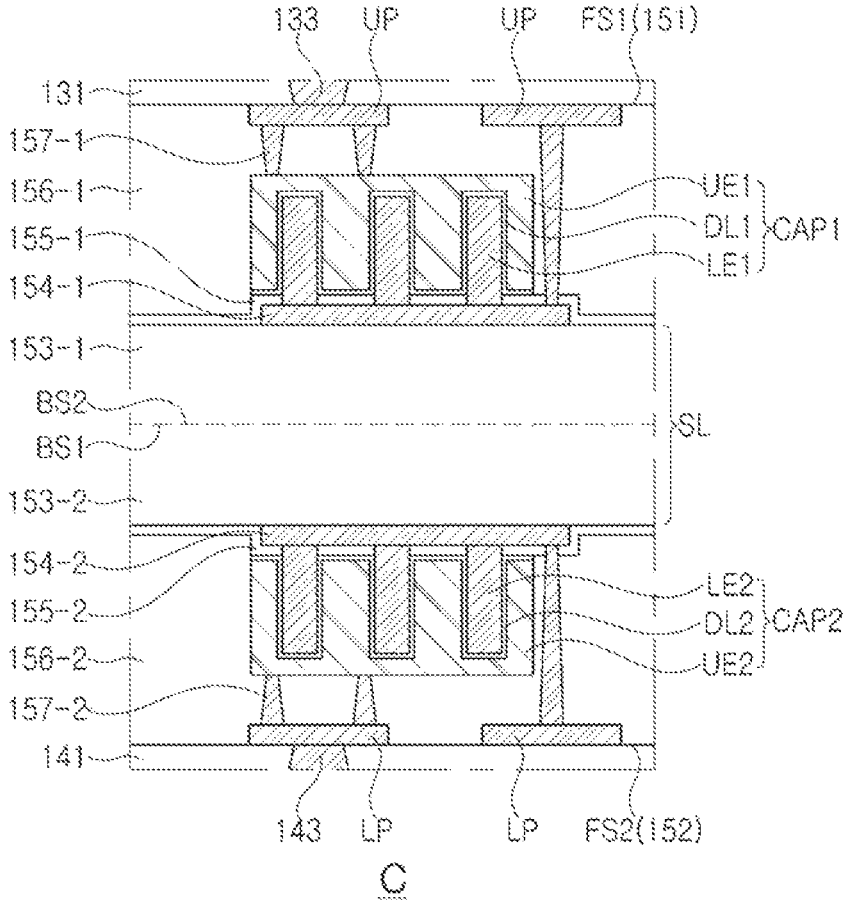
FIG. 5 is an enlarged view of the capacitor structure illustrated in FIG. 3 according to example embodiments.

FIG. 5 is an enlarged view of the capacitor structure illustrated in FIG. 3 according to example embodiments. FIG. 5 corresponds to region C illustrated in FIG. 3.

Referring to FIGS. 3 and 5, the capacitor structure 150 may be formed by bonding the upper structure US and the lower structure LS, as described above. The upper structure US may include a front surface FS1 on which the upper pad UP is disposed and a rear surface BS1 opposite to the front surface FS1, and the lower structure LS may include a front surface FS2 on which the lower pad LP is disposed and a rear surface BS2 opposite to the front surface FS2. The capacitor structure 150 may be formed by back-to-back bonding, for example, the rear surface BS1 of the upper structure US and the rear surface BS2 of the lower structure LS may be bonded to each other. That is, the front surface FS1 of the upper structure US may be an upper surface 151 of the capacitor structure 150, and the front surface FS2 of the lower structure LS may be a lower surface 152 of the capacitor structure 150. In an example embodiment, when the upper structure US contacts the lower structure LS, an oxide material such as silicon oxide may be interposed between the rear surface BS1 and the rear surface BS2. A thickness of the oxide material may be about 1 μm or less.

The upper structure US may include an upper substrate 153-1, an upper capacitor CAP1, an electrode pad 154-1, an insulating layer 155-1, an interlayer insulating layer 156-1, and a contact plug 157-1. The upper substrate 153-1 may include a semiconductor material, for example, a Group IV semiconductor, a Group III-V compound semiconductor, or a Group II-VI compound semiconductor. For example, the Group IV semiconductor may include silicon, germanium, or silicon-germanium. The substrate may be a silicon substrate, a silicon-on-insulator (SOI) substrate, a germanium substrate, a germanium-on-insulator (GOI) substrate, a silicon-germanium substrate, or a substrate including an epitaxial layer.

The electrode pad 154-1 may be disposed on the upper substrate 153-1, and the insulating layer 155-1 may cover or at least partially cover the upper substrate 153-1 and the electrode pad 154-1. The electrode pad 154-1 may be electrically connected to the upper capacitor CAP1.

The upper capacitor CAP1 may be disposed above the upper substrate 153-1. The upper capacitor CAP1 may include a lower electrode LE1, a capacitor dielectric layer DL1, and an upper electrode UE1. The lower electrodes LE1 may be disposed on the electrode pad 154-1, and may be connected to the electrode pad 154-1 by penetrating the insulating layer 155-1. The lower electrodes LE1 may have a pillar shape, but are not limited thereto, and may have a cylinder shape. Upper surfaces of the lower electrodes LE1 may be substantially coplanar. The lower electrodes LE1 may have a uniform upper width. In an example embodiment, the lower electrodes LE1 may be arranged in a zigzag or honeycomb form. In an example embodiment, the lower electrodes LE1 may be spaced apart from each other by a predetermined interval in first and second directions crossing each other and may be arranged in a matrix form. The lower electrodes LE1 may be commonly electrically connected to the electrode pad 154-1.

The capacitor dielectric layer DL1 may be conformally disposed along surfaces of the insulating layer 155-1 and the lower electrode LE1. The upper electrode UE1 may cover or at least partially cover the capacitor dielectric layer DL1 and fill a space between the lower electrodes LE1.

The lower electrode LE1 and the upper electrode UE1 may include at least one of a doped semiconductor, a metal nitride, a metal, and a metal oxide. The lower electrode LE1 and the upper electrode UE1 may include, for example, at least one of polycrystalline silicon, titanium nitride (TiN), tungsten (W), titanium (Ti), ruthenium (Ru), and tungsten nitride (WN). The capacitor dielectric layer DL1 may include at least one of high-k materials such as zirconium oxide ($ZrO_2$), aluminum oxide ($Al_2O_3$), and hafnium oxide ($Hf_2O_3$).

The interlayer insulating layer 156-1 may cover or at least partially cover the insulating layer and the upper capacitor CAP1. The contact plugs 157-1 may electrically connect the upper capacitor CAP1 and the electrode pad 154-1 to the upper pads UP. The upper pad UP, the electrode pad 154-1, and the contact plug 157-1 may include a conductive material such as copper (Cu). The interlayer insulating layer 156-1 may include silicon oxide, silicon nitride, silicon oxynitride, or combinations thereof.

The lower structure LS may include a lower substrate 153-2, a lower capacitor CAP2, an electrode pad 154-2, an insulating layer 155-2, an interlayer insulating layer 156-2 and a contact plug 157-2. A horizontal width of the lower substrate 153-2 may be equal to a horizontal width of the upper substrate 153-1, and a side surface of the lower substrate 153-2 may be coplanar with a side surface of the upper substrate 153-1. The lower substrate 153-2 may include the same material as the upper substrate 153-1, and may be materially continuous with the upper substrate 153-1. As used herein, in some embodiments, materially continuous may refer to the same material being continuous without an intervention of other materials, and a crystal structure may not need to be continuous. The lower structure LS may be disposed symmetrically to the upper structure US with respect to the rear surfaces BS1 and BS2. The upper substrate 153-1 and the lower substrate 153-2 may form a semiconductor layer SL. Each component of the lower structure LS may have the same or similar structure as a corresponding component of the upper structure US, and repeated description of components of the lower structure LS may be omitted.

Although one upper capacitor CAP1 and one lower capacitor CAP2 are illustrated in FIG. 5, the present disclosure is not limited thereto. The upper structure US may include a plurality of upper capacitors CAP1, and the lower structure LS may include a plurality of lower capacitors CAP2.

As illustrated in FIGS. 1 and 5, the capacitor structure 150 of the present disclosure may be formed by bonding the rear surface BS1 of the upper structure US and the rear surface BS2 of the lower structure LS. For example, in the upper structure US and the lower structure LS, each of the rear surface BS1 and BS2 may be formed thin through a grinding process, and the rear surfaces BS1 and BS2 may be bonded to each other by a wafer-on-wafer process. Because the rear surfaces BS1 and BS2 are bonded by the wafer-on-wafer process, other materials such as an adhesive may not be interposed between the rear surfaces BS1 and BS2, and the rear surfaces BS1 and BS2 may directly contact each other. Accordingly, a thickness of the capacitor structure 150 may be formed to be thin, and the capacitor structure 150 may be disposed in the interposer 110 having a smaller size, thereby reducing the size of the semiconductor package 100.

Because the rear BS1 of the upper structure US and the rear BS2 of the lower structure LS are bonded to each other, a total capacitance of the capacitor structure 150 may be greater than capacitances of each of the upper structure US and the lower structure LS. For example, the upper structure US may be connected in parallel with the lower structure LS, and the total capacitance of the capacitor structure 150 may be equal to a sum of the capacitance of the upper structure US and the capacitance of the lower structure LS. Accordingly, according to example embodiments of the present disclosure, a capacitor structure 150 having twice the capacitance in the same area as compared to each of the upper structure US or the lower structure LS may be implemented. Therefore, the capacitor structure 150 may have high capacitance, thereby improving power delivery characteristics and improving power integrity.

Because the capacitor structure 150 of the present disclosure is disposed in the interposer 110, an electrical path with the first semiconductor chip C1 may be shortened. Accordingly, power integrity may be improved.

Figure 6:
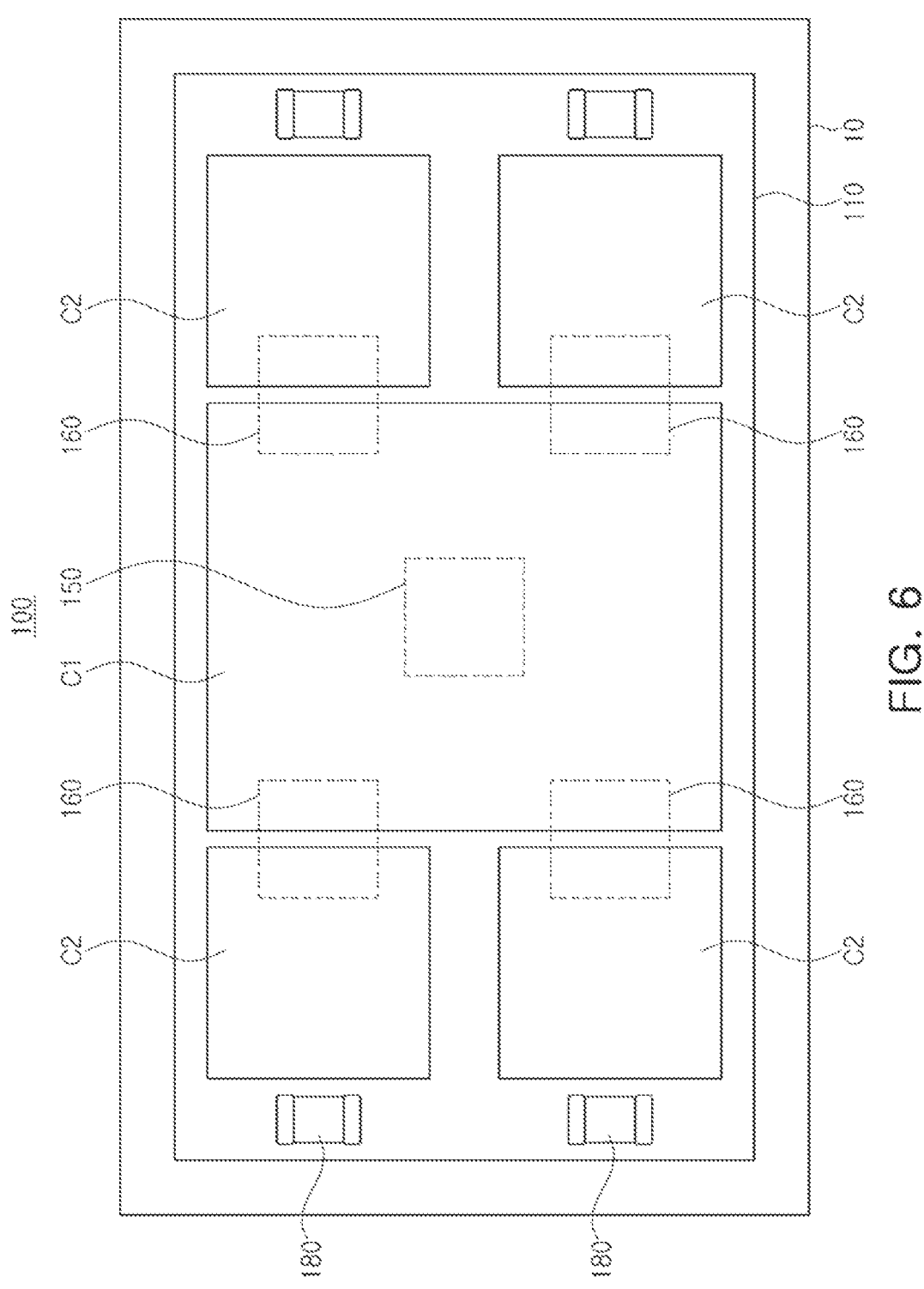
FIG. 6 is a top view of a semiconductor package according to example embodiments.

FIG. 6 is a top view of a semiconductor package according to example embodiments.

Referring to FIG. 6, the semiconductor package 100 may further include a passive element 180 disposed on an upper surface of the interposer 110. The passive element 180 may include a capacitor and an inductor. The passive element 180 may provide functions such as decoupling, filtering, resonance attenuation, and/or voltage regulation. In example embodiments, the semiconductor package 100 may further include a passive device disposed on upper or lower surface of the package substrate 10 and including a capacitor or an inductor.

Figure 7:
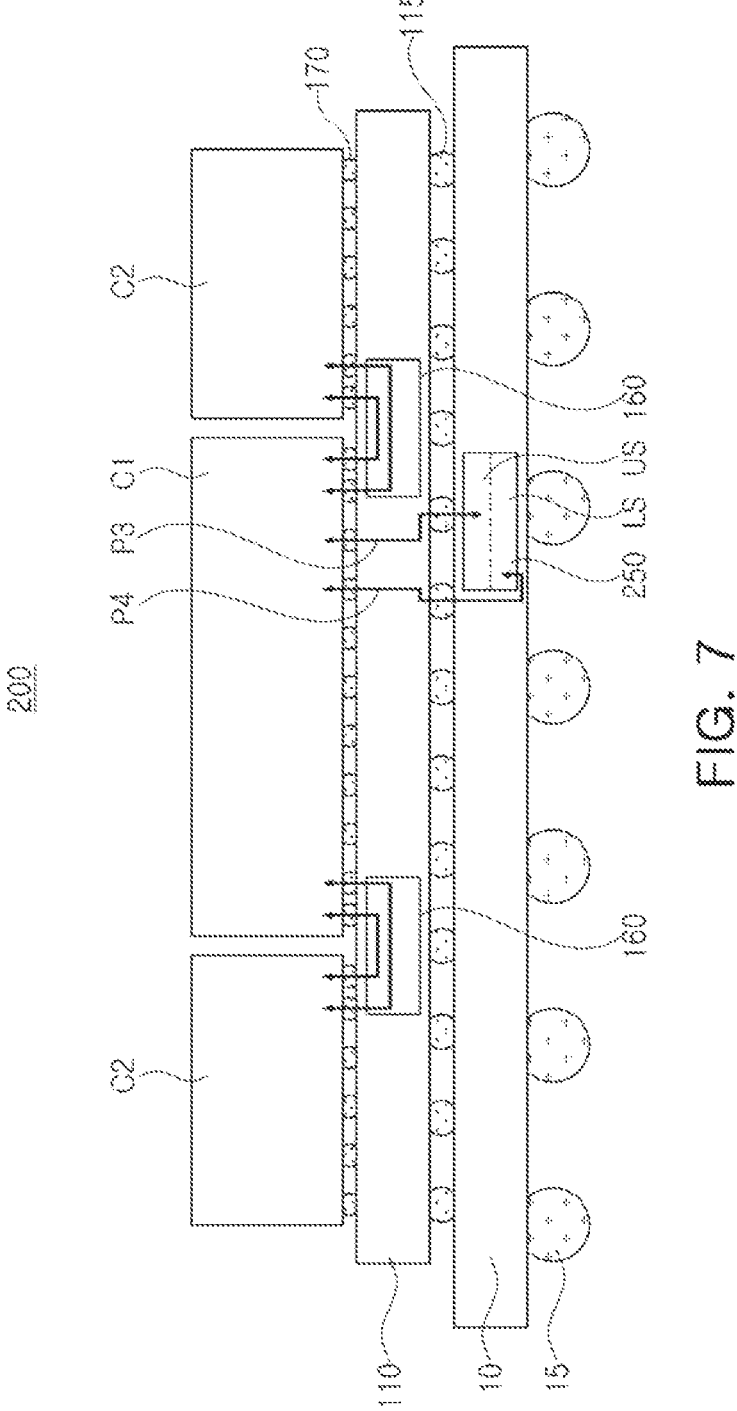
FIGS. 7 and 8 are cross-sectional views of a semiconductor package according to example embodiments.
Figure 8:
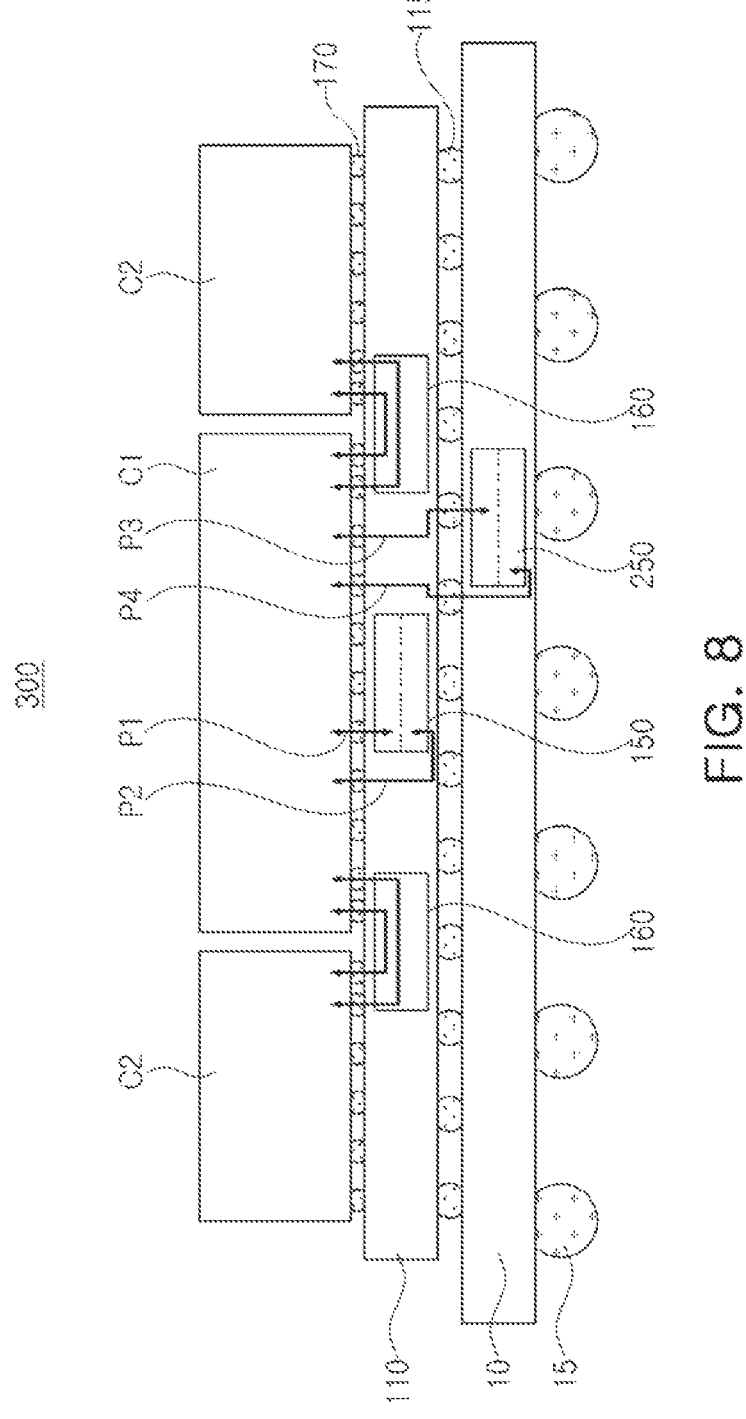

FIGS. 7 and 8 are cross-sectional views of a semiconductor package according to example embodiments.

Referring to FIG. 7, a semiconductor package 200 may include a capacitor structure 250 disposed in the package substrate 10. Because the capacitor structure 250 may have the same structure as the capacitor structure 150 of the semiconductor package 100 illustrated in FIG. 1, repeated descriptions thereof may be omitted. The capacitor structure 250 may provide a third power path P3 and a fourth power path P4. For example, an upper structure US of the capacitor structure 250 may provide the third power path P3 electrically connected to the first semiconductor chip C1 through the connection terminal 115, the interposer 110, and the chip connection terminal 170. Furthermore, a lower structure LS of the capacitor structure 250 can provide a fourth power path P4 electrically connected to the first semiconductor chip C1 through the connection terminal 115, the interposer 110, and the chip connection terminal 170. A total capacitance of the capacitor structure 250 may be greater than capacitances of each of the upper structure US and the lower structure LS, and, for example, the total capacitance of the capacitor structure 250 may be equal to a sum of the capacitances of the upper structure US and the lower structure LS.

Although illustrated in FIG. 7 that one capacitor structure 250 is disposed, the present disclosure is not limited thereto. In example embodiments, the semiconductor package 200 may include a plurality of capacitor structures 250 in the package substrate 10.

Referring to FIG. 8, a semiconductor package 300 may include a capacitor structure 150 disposed in an interposer 110 and a capacitor structure 250 disposed in a package substrate 10. The capacitor structure 150 may provide a first power path P1 and a second power path P2, and the capacitor structure 250 may provide a third power path P3 and a fourth power path P4.

Figure 9:
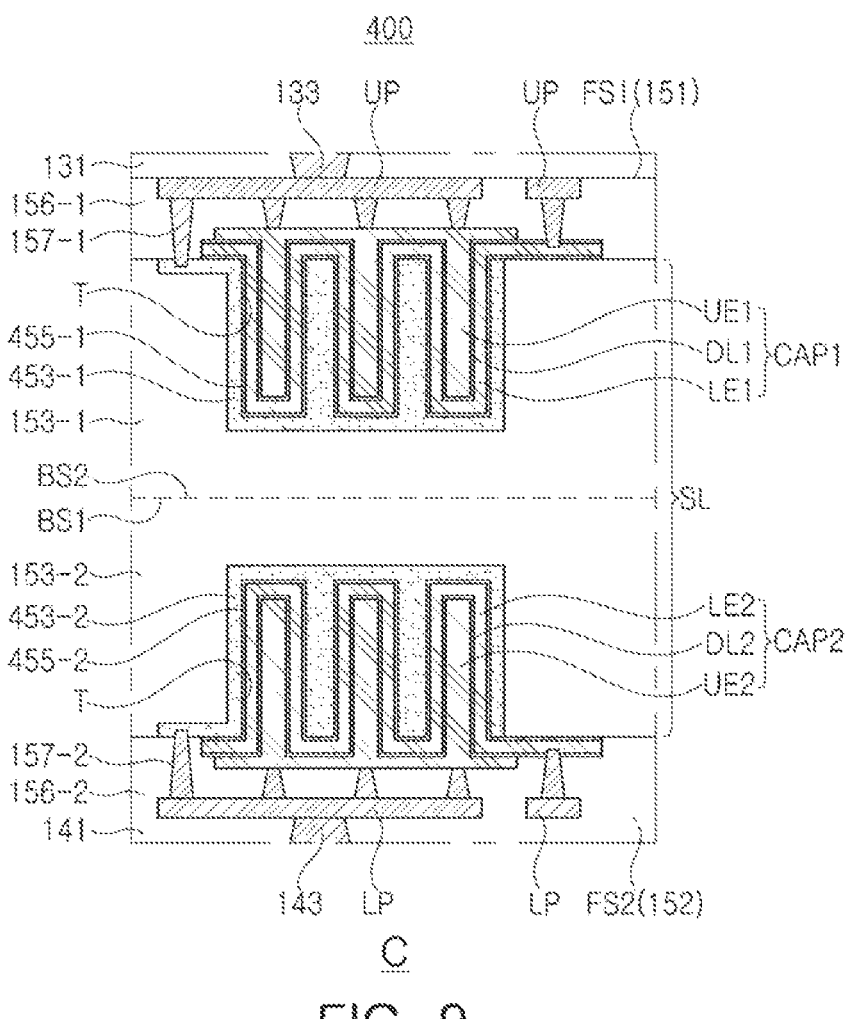
FIGS. 9 and 10 are cross-sectional views of a capacitor structure according to example embodiments.
Figure 10:
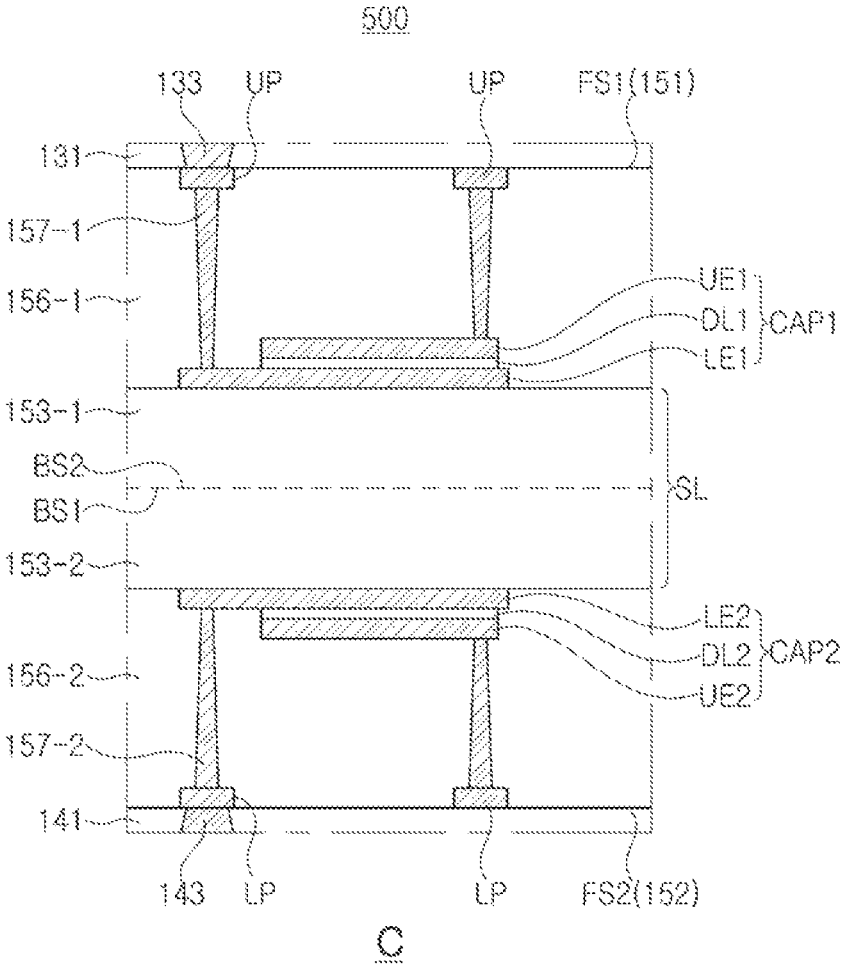

FIGS. 9 and 10 are cross-sectional views of a capacitor structure according to example embodiments.

Referring to FIG. 9, a semiconductor package 400 may include an upper capacitor CAP1 disposed in an upper structure US and a lower capacitor CAP2 disposed in a lower structure LS. In an example embodiment, the upper capacitor CAP1 and the lower capacitor CAP2 may be deep trench capacitors. The upper capacitor CAP1 may be disposed in an upper substrate 153-1, and the lower capacitor CAP2 may be disposed in a lower substrate 153-2.

The upper structure US may include a doping region 453-1 and an insulating layer 455-1. The doping region 453-1 may be disposed to surround the upper capacitor CAP1 embedded in the upper substrate 153-1. The doping region 453-1 may include n-type impurities. The lower electrode LE1 may be formed by forming holes T at regular intervals in the upper substrate 153-1 and conformally depositing a conductive material along and the holes T and an upper surface of the upper substrate 153-1. The capacitor dielectric layer DL1 may be conformally disposed along an upper surface of the lower electrode LE1. The upper electrode UE1 may cover or at least partially cover the capacitor dielectric layer DL1 and fill a space between the lower electrodes LE1. In an example embodiment, the lower electrode LE1 and the upper electrode UE1 may include tungsten or polysilicon. An insulating layer may be conformally disposed between the doping region 453-1 and the lower electrode LE1. The insulating layer 455-1 may include silicon oxide, silicon nitride, silicon oxynitride, or combinations thereof.

The doping region 453-1, the lower electrode LE1, and the upper electrode UE1 may be connected to a corresponding contact plug 157-1, and may be electrically connected to the upper pad UP. The lower structure LS may be symmetrical to the upper structure US with respect to the rear surfaces BS1 and BS2, and may have the same or similar structure as the upper structure US.

Referring to FIG. 10, a semiconductor package 500 may include an upper capacitor CAP1 disposed in an upper structure US and a lower capacitor CAP2 disposed in a lower structure LS. In an example embodiment, the upper capacitor CAP1 and the lower capacitor CAP2 may be metal-insulator-metal (MIM) capacitors.

A lower electrode LE1, a capacitor dielectric layer DL1, and an upper electrode UE1 may be disposed parallel to an upper surface of the upper substrate 153-1 and may extend in a horizontal direction. A horizontal width of the lower electrode LE1 may be greater than a horizontal width of the upper electrode UE1. The lower electrode LE1 and the upper electrode UE1 may be connected to a corresponding contact plug 157-1 and may be electrically connected to the upper pad UP. The lower structure LS may be symmetrical to the upper structure US with respect to the rear surfaces BS1 and BS2, and may have the same or similar structure as the upper structure US.

Figure 11:
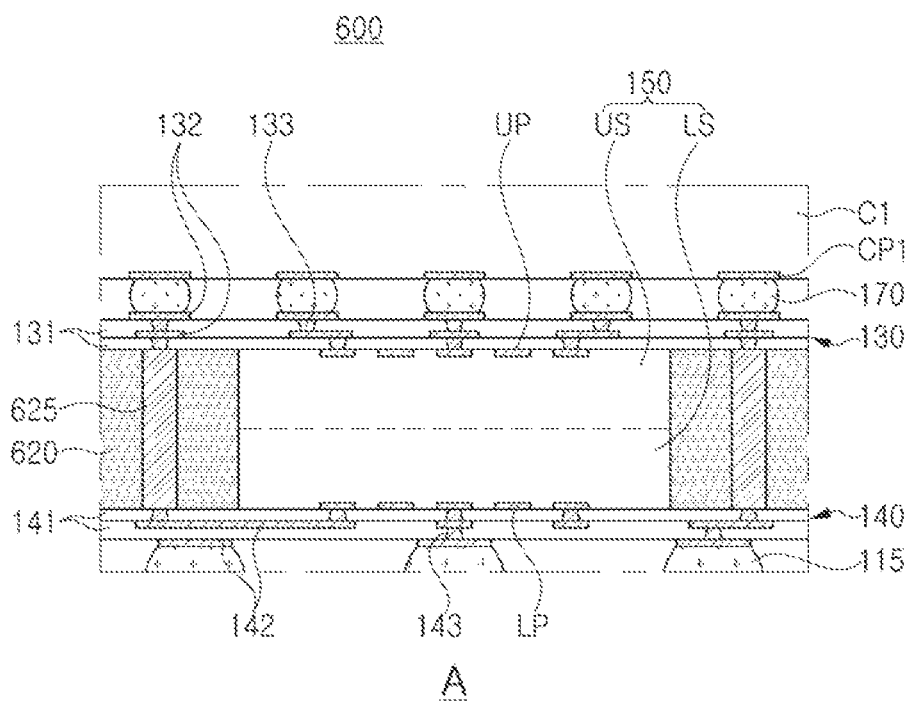
FIGS. 11 and 12 are cross-sectional views of a semiconductor package according to example embodiments.
Figure 12:
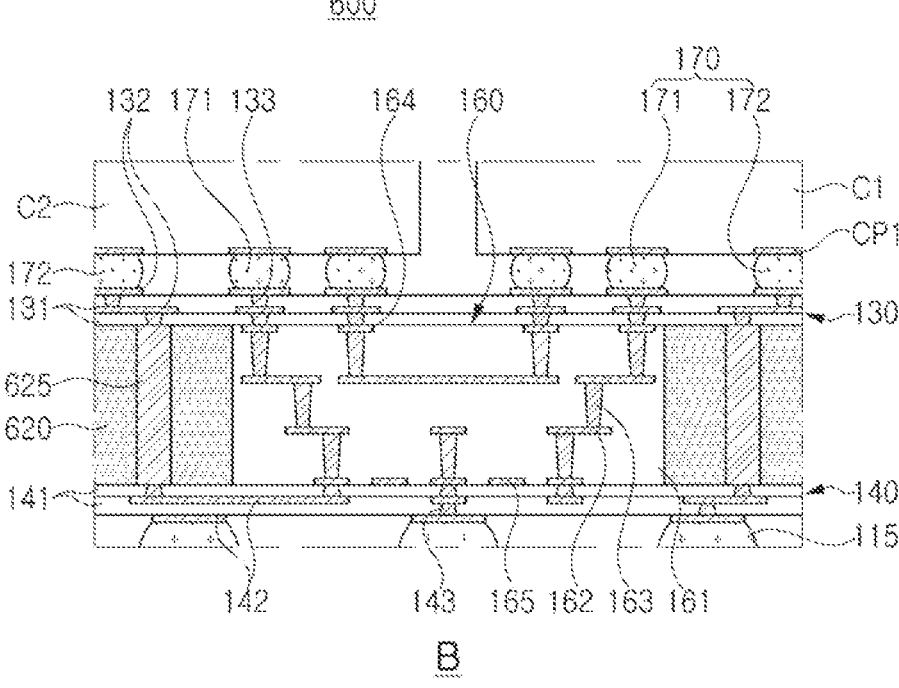

FIGS. 11 and 12 are cross-sectional views of a semiconductor package according to example embodiments.

Referring to FIGS. 11 and 12, an interposer 110 of a semiconductor package 600 may include a molding layer 620 and a through-via 625 as compared to the interposer 110 illustrated in FIGS. 3 and 4. The molding layer 620 may be disposed between an upper redistribution structure 130 and a lower redistribution structure 140. A capacitor structure 150 and a bridge 160 may be disposed within the molding layer 620, and side surfaces of the capacitor structure 150 and the bridge 160 may contact the molding layer 620. The through-via 625 may penetrate the molding layer 620 vertically and may be electrically connected to the upper redistribution structure 130 and the lower redistribution structure 140.

The molding layer 620 may include a thermosetting polymer material. In an example embodiment, the molding layer 620 may be a resin including an epoxy molding compound or polyimide. For example, the resin may include a Bisphenol-group Epoxy Resin, a Polycyclic Aromatic Epoxy Resin, an o-Cresol Novolac Epoxy Resin, a Biphenyl-based Epoxy Resin, or a Naphthalene-based Epoxy Resin. The through-via 625 may include a conductive material such as copper (Cu).

According to example embodiments of the present disclosure, a capacitor structure may be formed by bonding an upper structure including an upper capacitor and a lower structure including a lower capacitor. Accordingly, a capacitor structure with a higher capacitance may be implemented, and power integrity may be improved because an electrical path connected to a semiconductor chip is shortened.

Each of the embodiments provided in the above description is not excluded from being associated with one or more features of another example or another embodiment also provided herein or not provided herein but consistent with the disclosure While the disclosure has been particularly shown and described with reference to embodiments thereof, it will be understood that various changes in form and details may be made therein without departing from the spirit and scope of the following claims.

What is claimed is:

1. A semiconductor package comprising:
a package substrate;
an interposer above the package substrate;
a connection terminal between the package substrate and the interposer;
a first semiconductor chip and a second semiconductor chip above the interposer;
a bridge in the interposer, the bridge connected to the first semiconductor chip and the second semiconductor chip;
a capacitor structure in the interposer, the capacitor structure comprising:
an upper structure comprising an upper capacitor; and
a lower structure comprising a lower capacitor; and
chip connection terminals between the interposer and the first semiconductor chip and between the interposer and the second semiconductor chip,
wherein the upper structure comprises a first front surface and a first rear surface that is opposite to the first front surface,
wherein the lower structure comprises a second front surface and a second rear surface that is opposite to the second front surface, and
wherein the first rear surface directly contacts the second rear surface.

2. The semiconductor package of claim 1, wherein the first front surface is an upper surface of the capacitor structure, and
wherein the second front surface is a lower surface of the capacitor structure.

3. The semiconductor package of claim 1, wherein a capacitance of the capacitor structure is substantially equal to a sum of a capacitance of the upper structure and a capacitance of the lower structure.

4. The semiconductor package of claim 1, wherein the interposer comprises a core insulating layer and a through-via penetrating the core insulating layer.

5. The semiconductor package of claim 4, wherein the capacitor structure is configured to:
provide a first power path connecting the upper structure to the first semiconductor chip through the chip connection terminals, and
provide a second power path connecting the lower structure to the first semiconductor chip through the through-via and the chip connection terminals.

6. The semiconductor package of claim 4, wherein the interposer comprises:
an upper redistribution structure above the core insulating layer and above the capacitor structure, and
a lower redistribution structure below the core insulating layer and below the capacitor structure.

7. The semiconductor package of claim 6, wherein the upper structure is connected to the first semiconductor chip through the upper redistribution structure and the chip connection terminals, and
wherein the lower structure is connected to the first semiconductor chip through the lower redistribution structure, the through-via, and the chip connection terminals.

8. The semiconductor package of claim 1, wherein the first semiconductor chip and the second semiconductor chip at least partially overlap the bridge in a vertical direction.

9. The semiconductor package of claim 1, wherein the chip connection terminals comprise:

first chip connection terminals that are positioned within a width of the bridge; and second chip connection terminals that are not positioned within the width of the bridge, and wherein a pitch of the first chip connection terminals is less than a pitch of the second chip connection terminals.

10. The semiconductor package of claim 1, wherein the upper structure further comprises an upper substrate, wherein the lower structure further comprises a lower substrate, and wherein a lower surface of the upper substrate directly contacts an upper surface of the lower substrate.

11. The semiconductor package of claim 1, wherein the upper structure further comprises an electrode pad below the upper capacitor, and wherein the upper capacitor comprises:

a lower electrode on the electrode pad, a capacitor dielectric layer at least partially covering the lower electrode, and an upper electrode at least partially covering the capacitor dielectric layer.

12. The semiconductor package of claim 1, wherein the upper structure comprises an upper substrate comprises:

an upper surface; and a hole in the upper surface thereof, wherein the upper capacitor is in the upper substrate, and wherein the upper capacitor comprises:

a lower electrode at least partially covering the hole and the upper surface of the upper substrate, a capacitor dielectric layer at least partially covering the lower electrode, and an upper electrode at least partially covering the capacitor dielectric layer.

13. The semiconductor package of claim 1, wherein the upper structure further comprises an upper substrate, wherein the upper capacitor comprises a lower electrode, a capacitor dielectric layer, and an upper electrode sequentially stacked on the upper substrate, and wherein the lower electrode, the capacitor dielectric layer, and the upper electrode are parallel to an upper surface of the upper substrate.

14. The semiconductor package of claim 1, wherein the interposer comprises a molding layer at least partially covering a side surface of the capacitor structure and a through-via penetrating the molding layer, and wherein the molding layer comprises an epoxy molding compound.

15. The semiconductor package of claim 1, further comprising a capacitor on an upper surface of the interposer.

16. A semiconductor package comprising:

a package substrate;

an interposer above the package substrate;

a connection terminal between the package substrate and the interposer;

a first semiconductor chip and a second semiconductor chip above the interposer;

capacitor structures in at least one of the package substrate and the interposer, wherein each of the capacitor structures comprises:

an upper structure comprising an upper capacitor; and a lower structure comprising a lower capacitor; and chip connection terminals between the interposer and the first semiconductor chip and between the interposer and the second semiconductor chip, wherein the upper structure comprises a first front surface and a first rear surface that is opposite to the first front surface, wherein the lower structure comprises a second front surface and a second rear surface that is opposite to the second front surface, and wherein the first rear surface directly contacts the second rear surface.

17. The semiconductor package of claim 16, wherein the interposer comprises a through-via extending in a vertical direction, wherein a first capacitor structure of the capacitor structures is in the interposer, wherein a first upper structure of the first capacitor structure is configured to provide a first power path connected to the first semiconductor chip through the chip connection terminals, and wherein a first lower structure of the first capacitor structure is configured to provide a second power path connected to the first semiconductor chip through the through-via and the chip connection terminals.

18. The semiconductor package of claim 17, wherein a second capacitor structure of the capacitor structures is in the package substrate, wherein a second upper structure of the second capacitor structure is configured to provide a third power path connected to the first semiconductor chip through the connection terminal, the interposer, and the chip connection terminals, and wherein a second lower structure of the first capacitor structure is configured to provide a fourth power path connected to the first semiconductor chip through the connection terminal, the interposer, and the chip connection terminals.

19. A semiconductor package comprising:

a package substrate;

an interposer above the package substrate;

a first semiconductor chip and a second semiconductor chip above the interposer;

a capacitor structure in the interposer and comprising a semiconductor layer; and chip connection terminals between the interposer and the first semiconductor chip and between the interposer and the second semiconductor chip, wherein the capacitor structure comprises:

an upper capacitor in the semiconductor layer or on the semiconductor layer, and a lower capacitor in the semiconductor layer or below the semiconductor layer, wherein the semiconductor layer comprises a lower substrate and an upper substrate on the lower substrate, and wherein the lower substrate is materially continuous with the upper substrate.

20. The semiconductor package of claim 19, wherein a lower surface of the upper substrate directly contacts an upper surface of the lower substrate.

* * * * *